United States Patent
Migiyama et al.

(10) Patent No.: US 11,342,208 B2
(45) Date of Patent: May 24, 2022

(54) PROCESSING METHOD AND RESIN APPLYING MACHINE

(71) Applicant: DISCO CORPORATION, Tokyo (JP)

(72) Inventors: Yoshikuni Migiyama, Tokyo (JP); Kazuki Sugiura, Tokyo (JP); Yoshinori Kakinuma, Tokyo (JP); Mitsuru Ikushima, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 133 days.

(21) Appl. No.: 16/925,578

(22) Filed: Jul. 10, 2020

(65) Prior Publication Data
US 2021/0028027 A1 Jan. 28, 2021

(30) Foreign Application Priority Data

Jul. 23, 2019 (JP) .............................. JP2019-135638

(51) Int. Cl.
*H01L 21/67* (2006.01)
*H01L 21/56* (2006.01)

(52) U.S. Cl.
CPC .......... *H01L 21/6715* (2013.01); *H01L 21/56* (2013.01); *H01L 21/67253* (2013.01)

(58) Field of Classification Search
CPC ................ H01L 21/6715; H01L 21/56; H01L 21/67253; H01L 21/67092; H01L 21/67115; H01L 21/561; H01L 21/67132; H01L 22/12; H01L 22/20; H01L 21/6835; H01L 2221/6834

See application file for complete search history.

(56) References Cited

U.S. PATENT DOCUMENTS

| | | | | |
|---|---|---|---|---|
| 8,016,643 | B2* | 9/2011 | Sekiya | H01L 21/304 451/41 |
| 2002/0106868 | A1* | 8/2002 | Saimoto | H01L 24/27 438/459 |
| 2002/0127821 | A1* | 9/2002 | Ohya | H01L 21/6835 438/459 |
| 2003/0215582 | A1* | 11/2003 | Bermel | B29C 41/12 428/1.31 |
| 2021/0028026 | A1* | 1/2021 | Migiyama | H01L 21/6715 |

FOREIGN PATENT DOCUMENTS

JP 2016167546 A 9/2016

\* cited by examiner

*Primary Examiner* — Mohammed Shamsuzzaman
(74) *Attorney, Agent, or Firm* — Greer Burns & Crain Ltd.

(57) ABSTRACT

There is provided a processing method including the steps of measuring a thickness of the wafer, holding the wafer on a holder, supplying a liquid resin to a table that faces the holder, relatively moving the holder and the table closely to each other to coat the wafer with the liquid resin, and hardening the liquid resin that has coated the wafer. In the resin applying step, a distance by which the holder and the table are to be relatively moved closely to each other to coat the wafer with the liquid resin is determined depending on the measured thickness of the wafer.

1 Claim, 8 Drawing Sheets

PROCESSING METHOD AND RESIN APPLYING MACHINE

BACKGROUND OF THE INVENTION

Field of the Invention

The present invention relates to a processing method and a resin applying machine for coating one surface of a wafer with a resin.

Description of the Related Art

There is known a technology in which a holder holding a wafer and a table supplied with a liquid resin are brought closely to each other to coat one surface of the wafer with the resin (see Japanese Patent Laid-Open No. 2016-167546).

SUMMARY OF THE INVENTION

In a case where a bumpy surface of a wafer with bumps is coated with a resin to make the surface irregularities even and the opposite surface of the wafer is cut or ground, if the resin layer is not of a constant thickness, the wafer tends to be cut to varying depths or ground to different thicknesses. Furthermore, since a predetermined fixed value is given to indicate how close the holder and the table should be to each other in coating the wafer with the resin, any thickness variations of the wafer are liable to fail to coat the wafer to a uniform thickness with the resin.

It is therefore an object of the present invention to provide a processing method and a resin applying machine which are capable of reducing variations of the thickness of a resin with which to coat a wafer.

In accordance with an aspect of the present invention, there is provided a processing method for coating a surface of a wafer with a resin, including the steps of measuring a thickness of the wafer, holding the wafer on a holder, supplying a liquid resin to a table that faces the holder, relatively moving the holder and the table closely to each other to coat the wafer with the liquid resin, and hardening the liquid resin that has coated the wafer. A distance by which the holder and the table are to be relatively moved closely to each other to coat the wafer with the liquid resin is determined depending on the measured thickness of the wafer.

In accordance with another aspect of the present invention, there is provided a resin applying machine for coating a surface of a wafer with a resin, including a thickness measuring unit for measuring a thickness of the wafer, a holder for holding the wafer, a table that faces the holder, a resin supply unit for supplying a liquid resin to the table, a moving unit for relatively moving the holder and the table closely to each other to coat the wafer with the liquid resin, a hardening unit for hardening the liquid resin that has coated the wafer, and a controller for controlling the thickness measuring unit and the moving unit. The controller determines a distance by which the holder and the table are to be relatively moved closely to each other to coat the wafer with the liquid resin, depending on the thickness of the wafer that has been measured by the thickness measuring unit.

The resin applying machine may further include a temporary rest table having a holding surface for holding the wafer thereon, the holding surface having a diameter smaller than a diameter of the wafer. The thickness measuring unit may include a first measuring section for contacting a portion of a face side of the wafer that protrudes from the temporary rest table and measuring a height of the face side of the wafer, a second measuring section for contacting a portion of a reverse side of the wafer that protrudes from the temporary rest table and measuring a height of the reverse side of the wafer, and a calculating section for calculating the thickness of the wafer from a difference between the height of the face side and the height of the reverse side.

According to the aspects of the present invention, it is possible to reduce variations of the thickness of the resin that has coated the wafer.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Modes for carrying out the present invention, i.e., embodiments of the present invention, will hereinafter be described in detail with reference to the drawings. The present invention is not limited to the details of the embodiments described below. The components described below cover those which could easily be anticipated by those skilled in the art and those which are essentially identical thereto. Furthermore, the arrangements described below can be used in appropriate combinations. Various omissions, replacements, or changes of the arrangements may be made without departing from the scope of the present invention.

First Embodiment

Figure 1:
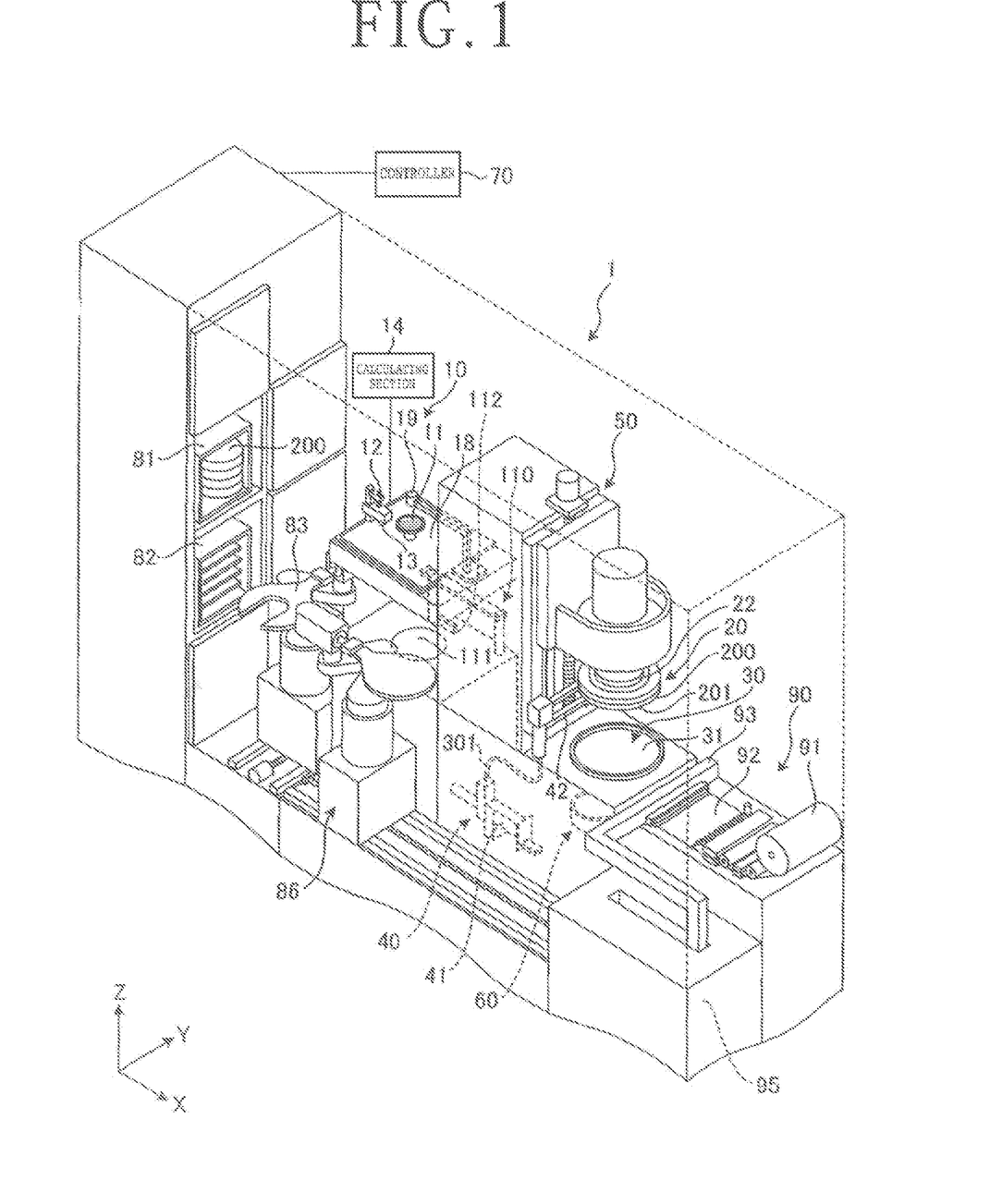
FIG. 1 is a perspective view illustrating a structural example of a resin applying machine according to a first embodiment of the present invention.
Figure 2:
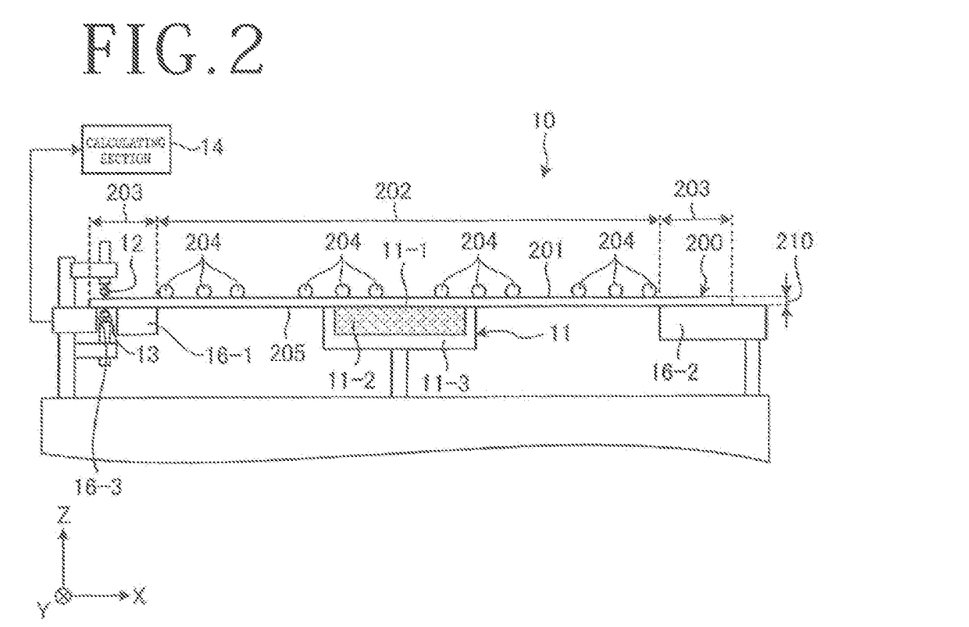
FIG. 2 is a cross-sectional view of essential details of a thickness measuring unit of the resin applying machine illustrated in FIG. 1.
Figure 3:
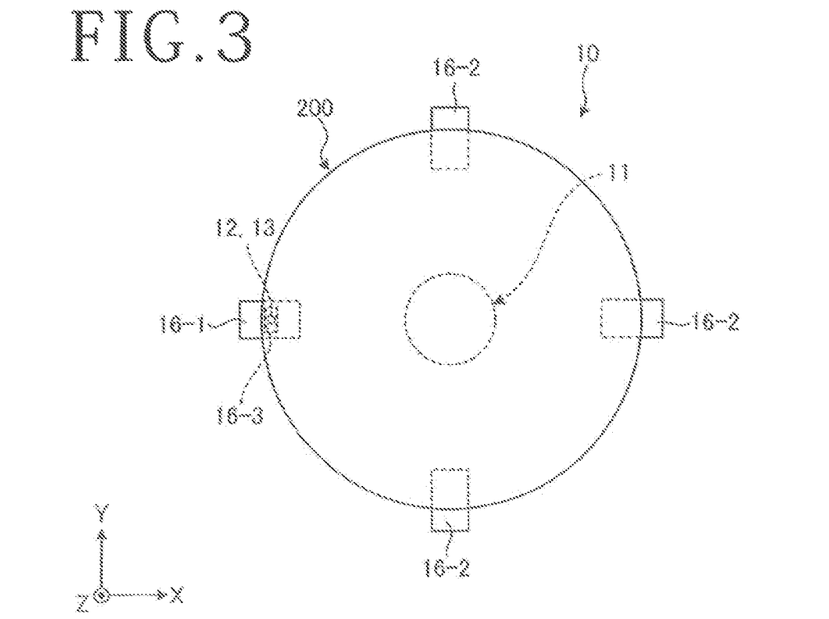
FIG. 3 is a plan view of the essential details of the thickness measuring unit of the resin applying machine illustrated in FIG. 1.

A resin applying machine 1 and a processing method according to a first embodiment of the present invention will be described below with reference to the drawings. FIG. 1 illustrates in perspective a structural example of the resin applying machine 1 according to the first embodiment. FIG. 2 illustrates in cross section essential details of a thickness measuring unit 10 of the resin applying machine 1 illustrated in FIG. 1. FIG. 3 illustrates in plan the essential details of the thickness measuring unit 10 of the resin applying machine 1 illustrated in FIG. 1. The resin applying machine 1 is an apparatus that carries out a processing method for coating a face side 201 that is one surface of a wafer 200 with a resin 302.

According to the first embodiment, the wafer 200, which is an object to be coated with the resin 302 by the resin applying machine 1, is a semiconductor wafer, an optical device wafer, or the like that is shaped as a circular plate made of a base material such as silicon, sapphire, or gallium arsenide, for example. Since the wafer 200 is also an object to be processed by the processing method according to the first embodiment on the resin applying machine 1, the wafer 200 is also referred to as "workpiece." As illustrated in FIG. 2, the wafer 200 includes a device area 202 where devices are formed on the face side 201 and an outer circumferential excess area 203 surrounding the device area 202.

As illustrated in FIG. 2, plural bumps 204 having a function as electrodes are disposed on face sides of devices formed on the face side 201 of the wafer 200 within the device area 202. The bumps 204 protrude from the face sides of the devices. The devices have surface irregularities on their face sides because of the bumps 204 thereon. The wafer 200 has a flat reverse side 205 opposite the face side 201 thereof.

As the devices on the wafer 200 have surface irregularities on their face sides because of the bumps 204 thereon, the resin applying machine 1 and the processing method according to the first embodiment are highly advantageous when applied to the wafer 200. However, the present invention is not limited to such an application, but may be applied to a packaged substrate having surface irregularities in which devices and wires connected to the devices by wire bonding are sealed by a sealant made of a molding resin, a wafer having no surface irregularities, a packaged substrate having no surface irregularities, or an as-sliced wafer before devices are formed thereon.

As illustrated in FIG. 1, the resin applying machine 1 includes a thickness measuring unit 10 for measuring a thickness 210 of the wafer 200, a holder 20 for holding the wafer 200, a table 30 disposed in facing relation to the holder 20, a resin supply unit 40 for supplying a liquid resin 301 to the table 30, a moving unit 50 for moving the holder 20 and the table 30 relatively closely to each other to coat the wafer 200 with the liquid resin 301, a hardening unit 60 for hardening the liquid resin 301 applied to the wafer 200, and a controller 70 for controlling the members and mechanisms of the resin applying machine 1.

As illustrated in FIGS. 1, 2, and 3, the resin applying machine 1 also includes a temporary rest table 11 for holding the wafer 200, disposed in a predetermined position in the thickness measuring unit 10 and having a diameter smaller than a diameter of the wafer 200. As illustrated in FIG. 2, the temporary rest table 11 includes an attracting member 11-2 having a flat holding surface 11-1 as its upper surface and a frame 11-3 supporting the attracting member 11-2 securely fitted in a cavity defined centrally in the frame 11-3 and opening upwardly. The attracting member 11-2 is of a disk shape and made of porous ceramics or the like having a number of pores therein. The attracting member 11-2 is connected to a vacuum suction source, not illustrated, through a vacuum suction channel, not illustrated. The holding surface 11-1 holds the wafer 200 thereon under suction forces generated by the vacuum suction source and acting through the vacuum suction channel on the holding surface 11-1.

As illustrated in FIGS. 1 and 2, the thickness measuring unit 10 includes a first measuring section 12 for contacting a portion of the face side 201 of the wafer 200 that protrudes radially outwardly from the temporary rest table 11 and measuring a height of the face side 201 of the wafer 200, a second measuring section 13 for contacting a portion of the reverse side 205 of the wafer 200 that protrudes radially outwardly from the temporary rest table 11 and measuring a height of the reverse side 205 of the wafer 200, and a calculating section 14 for calculating the thickness 210 of the wafer 200 from a difference between the height of the face side 201 and the height of the reverse side 205.

Each of the first measuring section 12 and the second measuring section 13 includes a probe for contacting the wafer 200, an actuator for moving the probe in vertical directions, i.e., Z-axis directions, as thicknesswise directions of the wafer 200, and a position measuring part for measuring the position of the probe in the vertical directions. The actuator and the position measuring part are electrically connected to the calculating section 14 for transmitting information therebetween. The first measuring section 12 and the second measuring section 13 send information representing the measured heights to the calculating section 14.

As illustrated in FIGS. 2 and 3, the first measuring section 12 and the second measuring section 13 are disposed in vertically facing relation to each other at respective predetermined positions with respect to the temporary rest table 11. As illustrated in FIG. 2, the first measuring section 12 is disposed vertically above the holding surface 11-1 of the temporary rest table 11 with its probe facing downwardly. As illustrated in FIG. 2, the second measuring section 13 is disposed vertically beneath the holding surface 11-1 of the temporary rest table 11 with its probe facing upwardly.

As illustrated in FIG. 2, the first measuring section 12 and the second measuring section 13 should preferably be disposed in respective positions facing the outer circumferential excess area 203 of the wafer 200. The first measuring section 12 and the second measuring section 13 thus positioned are able to measure the thickness 210 of the wafer 200 at a location free of the bumps 204 as the probes do not contact the device area 202 and hence the bumps 204.

The calculating section 14 is a computer including an arithmetic processing apparatus having a microprocessor such as a central processing unit (CPU), a storage apparatus having a memory such as a read only memory (ROM) or a random access memory (RAM), and an input/output interface apparatus. The arithmetic processing apparatus of the calculating section 14 carries out arithmetic processing operations according to computer programs stored in the storage apparatus to calculate the thickness 210 of the wafer 200 from the difference between the height of the face side 201 and the height of the reverse side 205, and outputs the calculated thickness 210 to the controller 70 that is electrically connected to the calculating section 14 for transmitting information therebetween.

As illustrated in FIGS. 2 and 3, the resin applying machine 1 should preferably further include a plurality of support bases 16-1 and 16-2 surrounding the temporary rest table 11 radially outwardly thereof and arrayed at equal angular intervals circumferentially around the temporary rest table 11. The support base 16-1 is disposed in a predetermined position where the first measuring section 12 and the second measuring section 13 are located, and has a through hole 16-3 defined vertically therein for receiving the respective probes, inserted therein, of the first measuring section 12 and the second measuring section 13. The support bases 16-1 and 16-2 have respective upper surfaces at the same height as the holding surface 11-1 of the temporary rest table 11. These upper surfaces of the support bases 16-1 and 16-2 support an outer edge of the wafer 200 from the reverse side 205 thereof. The resin applying machine 1 with the support bases 16-1 and 16-2 is capable of supporting the wafer 200 without letting the wafer 200 flex vertically, the thickness measuring unit 10 can measure the thickness 210 of the wafer 200 more accurately.

According to the first embodiment, the first measuring section 12 and the second measuring section 13 of the thickness measuring unit 10 are of the contact type. However, the present invention is not limited to such details. The thickness measuring unit 10 may include non-contact-type measuring sections such as optical sensors that use a medium such as a laser beam or back-pressure sensors that use a medium such as a fluid. According to the first embodiment, the thickness measuring unit 10 measures the thickness 210 of the wafer 200 in one location on the outer circumferential excess area 203. However, the present invention is not limited to such details, but the thickness measuring unit 10 may measure the thickness 210 of the wafer 200 in two or more locations thereon.

As illustrated in FIG. 1, the thickness measuring unit 10 further includes an illuminating unit 18 and an image capturing unit 19. The illuminating unit 18 is disposed below the temporary rest table 11 in the thicknesswise directions of the wafer 200, and extends horizontally in radial directions of the wafer 200. The illuminating unit 18 emits illuminating light toward the wafer 200 that is placed on the temporary rest table 11. The image capturing unit 19 is disposed above the center of the holding surface 11-1 of the temporary rest table 11 in the thicknesswise directions of the wafer 200, and faces downwardly. The image capturing unit 19 captures an image of the wafer 200 that is placed on the temporary rest table 11, and detects illuminating light emitted from the illuminating unit 18. The image capturing unit 19 detects the center of the wafer 200 from the captured image of the wafer 200, and also detects the radial shape of the wafer 200 from the detected illuminating light emitted from the illuminating unit 18.

The thickness measuring unit 10 measures the diameter of the wafer 200 that represents the radial size of the wafer 200 on the basis of the detected radial shape of the wafer 200 from the image capturing unit 19. Furthermore, the thickness measuring unit 10 aligns the center of the wafer 200 and aligns the orientation of the wafer 200 on the basis of the detected center of the wafer 200 and the detected radial shape of the wafer 200 from the image capturing unit 19.

The holder 20 holds the wafer 200 on a lower end thereof under suction forces applied to the wafer 200 from above. The holder 20 is vertically movably supported on the moving unit 50. The holder 20 includes a pressing force measuring unit 22 disposed vertically above the position where the wafer 200 is held, i.e., the lower end of the holder 20. The pressing force measuring unit 22 is capable of measuring a pressing force applied downwardly through the holder 20. Specifically, the pressing force measuring unit 22 can measure a pressing force applied when the holder 20 spreads the liquid resin 301.

The table 30 has a holding surface 31 that is slightly larger in diameter than the diameter of the wafer 200. The table 30 holds on the holding surface 31 thereof a sheet 92 supplied from a sheet supply unit 90 to be described later. The liquid resin 301 supplied from the resin supply unit 40 is supplied to the sheet 92 held on the holding surface 31. A hardening unit 60 is disposed vertically below the table 30, which is integrally combined with the hardening unit 60. The hardening unit 60 hardens the liquid resin 301 supplied to the sheet 92 through the sheet 92 held on the holding surface 31.

The resin supply unit 40 includes a resin supply source 41 as a source for supplying the liquid resin 301 and a nozzle 42 for ejecting the liquid resin 301 from the resin supply source 41 toward the holding surface 31 of the table 30. According to the first embodiment, the liquid resin 301 supplied from the resin supply unit 40 should preferably have a viscosity in the range of 0.5 to 400 Pa·s.

According to the first embodiment, the liquid resin 301 supplied from the resin supply unit 40 is an ultraviolet-curable resin. However, the present invention is not limited to such details. The liquid resin 301 may instead be a thermosetting resin. In a case where the liquid resin 301 supplied from the resin supply unit 40 is an ultraviolet-curable resin, it is made up of an ultraviolet-curable resin component and a binder polymer component such as acrylic polymer. In a case where the liquid resin 301 supplied from the resin supply unit 40 is a thermosetting resin, it is made up of a thermosetting resin component such as an epoxy resin or a phenolic resin and a binder polymer component such as acrylic polymer. The liquid resin 301 supplied from the resin supply unit 40 may alternatively be a mixture of ultraviolet-curable resin and thermosetting resin.

Figure 10:
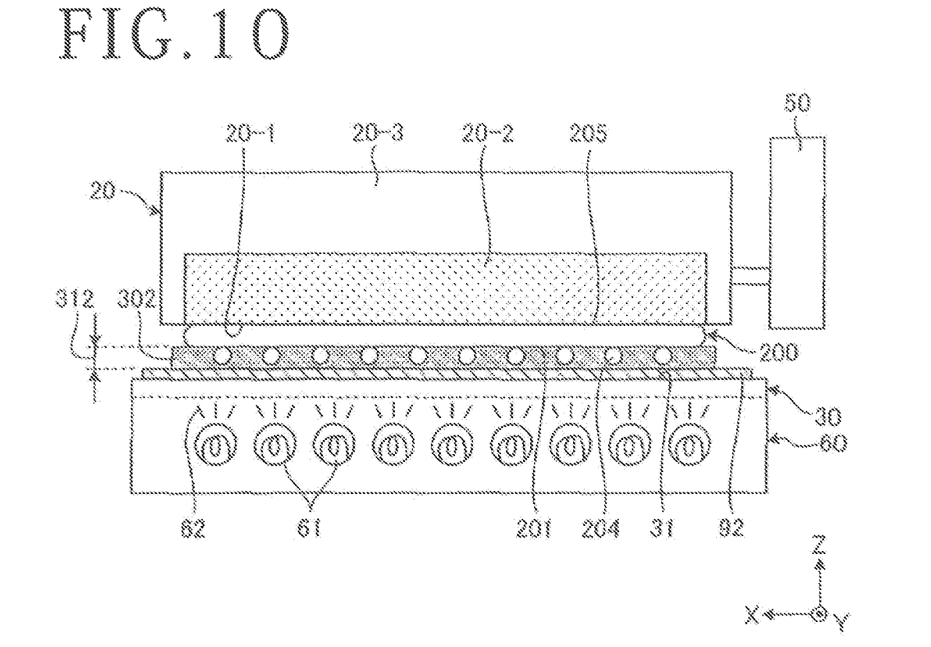
FIG. 10 is a cross-sectional view illustrating essential details of a hardening step of the sequence illustrated in FIG. 4.

According to the first embodiment, inasmuch as the liquid resin 301 is an ultraviolet-curable resin, the hardening unit 60 includes a plurality of ultraviolet ray emission sections 61 (see FIG. 5, etc.) arrayed in a horizontal array for emitting ultraviolet rays 62 (see FIG. 10). The ultraviolet ray emission sections 61 may be ultraviolet light-emitting diodes (LEDs), for example. Therefore, the table 30 and the sheet 92, to be described later, are made of materials capable of transmitting therethrough at least part of the ultraviolet rays 62. For example, the table 30 may be made of glass transparent to ultraviolet rays. However, the present invention is not limited to such details. The liquid resin 301 may be a thermosetting resin, the hardening unit 60 may be a heater, and the table 30 and the sheet 92 may be made of a material that is sufficiently thermally conductive.

The controller 70 controls the members and mechanisms of the resin applying machine 1 to enable the resin applying machine 1 to perform various operations. The controller 70 is a computer including an arithmetic processing apparatus having a microprocessor such as a CPU, a storage apparatus having a memory such as a ROM or a RAM, and an input/output interface apparatus. The arithmetic processing apparatus of the controller 70 carries out arithmetic processing operations according to computer programs stored in the storage apparatus to output control signals for controlling the resin applying machine 1 through the input/output interface apparatus to the members and mechanisms of the resin applying machine 1. According to the first embodiment, the controller 70 and the calculating section 14 are separate from each other. However, the present invention is not limited to such details. Rather, the controller 70 and the calculating section 14 may be integrally implemented by a single computer.

As illustrated in FIG. 1, the resin applying machine 1 further includes a pair of cassettes 81 and 82, a loading/unloading unit 83, and a delivery unit 86. Each of the cassettes 81 and 82 is constructed as a housing for accommodating wafers 200, the housing having a plurality of slots for receiving the respective wafers 200 therein. The cassette 81 accommodates therein wafers 200 to be processed by the resin applying machine 1, whereas the cassette 82 accommodates therein wafers 200 that have been processed by the resin applying machine 1.

The loading/unloading unit 83 unloads a wafer 200 to be processed from the cassette 81 onto the temporary rest table 11 and loads a processed wafer 200 from an excess portion removing unit 110, to be described later, into the cassette 82.

The delivery unit 86 delivers a wafer 200, whose thickness 210 and diameter have been measured by the thickness measuring unit 10 and whose center and orientation have been aligned by the thickness measuring unit 10, from the temporary rest table 11 to the holder 20, and delivers a wafer 200, whose face side 201 has been coated with the resin 302, from the holder 20 to the excess portion removing unit 110.

As illustrated in FIG. 1, the resin applying machine 1 further includes the sheet supply unit 90. The sheet supply unit 90 pulls out a sheet 92 from a sheet roll 91 where the sheet 92 with both surfaces being flat is wound in a roll, and cuts the sheet 92 into a predetermined length. The sheet 92 of the cut length is attracted and held under suction by attracting members 94 (see FIG. 5) disposed vertically beneath a sheet delivery unit 93, and is then delivered onto the holding surface 31 of the table 30 by the sheet delivery unit 93 that is actuated by an actuator 95. According to the first embodiment, the sheet 92 is slightly larger than the holding surface 31 of the table 30. According to the first embodiment, the sheet 92 is made of a material capable of transmitting therethrough at least part of the ultraviolet rays 62. For example, the sheet 92 may be made of polyolefin (PO), polyethylene terephthalate (PET), or the like.

As illustrated in FIG. 1, the resin applying machine 1 further includes the excess portion removing unit 110. The excess portion removing unit 110 has a holding table 111 for holding a wafer 200 whose face side 201 has been coated with the resin 302, and a cutter 112 for cutting off an excess portion, which protrudes radially outwardly from the outer edge of the wafer 200, of the resin 302 that has coated the face side 201 of the wafer 200 held on the holding table 111.

Figure 4:
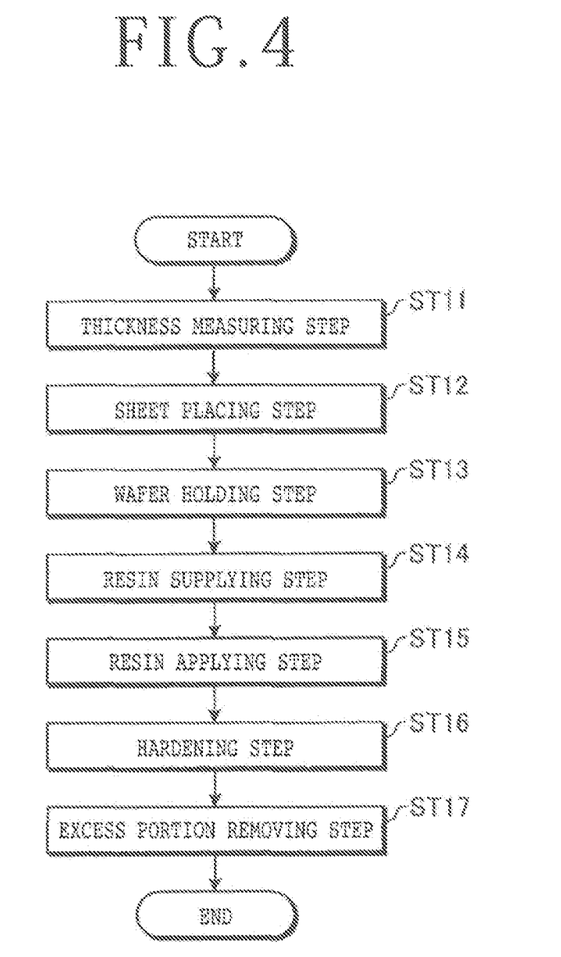
FIG. 4 is a flowchart of a sequence of a processing method according to the first embodiment.

Operation of the resin applying machine 1 according to the first embodiment will be described below. FIG. 4 is a flowchart of a sequence of the processing method according to the first embodiment. The processing method according to the first embodiment represents an example of operation of the resin applying machine 1. As illustrated in FIG. 4, the processing method includes thickness measuring step ST11, sheet placing step ST12, wafer holding step ST13, resin supplying step ST14, resin applying step ST15, hardening step ST16, and excess portion removing step ST17.

Thickness measuring step ST11 is a step in which the thickness measuring unit 10 measures the thickness 210 of the wafer 200. In thickness measuring step ST11, specifically, the loading/unloading unit 83 unloads a wafer 200, which is an object whose thickness 210 is to be measured by the thickness measuring unit 10, from the cassette 81 onto the temporary rest table 11.

Next, in thickness measuring step ST11, as illustrated in FIG. 2, the first measuring section 12 of the thickness measuring unit 10 contacts the face side 201 of the wafer 200, measures the height of the face side 201, and transmits information of the measured height to the calculating section 14, and the second measuring section 13 of the thickness measuring unit 10 contacts the reverse side 205 of the wafer 200, measures the height of the reverse side 205, and transmits information of the measured height to the calculating section 14. In thickness measuring step ST11, the calculating section 14 of the thickness measuring unit 10 then calculates the thickness 210 of the wafer 200 by subtracting the height measured by the second measuring section 13 form the height measured by the first measuring section 12, thereby obtaining the measured thickness 210 of the wafer 200. In thickness measuring step ST11, thereafter, the calculating section 14 of the thickness measuring unit 10 outputs and transmits the measured thickness 210 of the wafer 200 to the controller 70.

Figure 5:
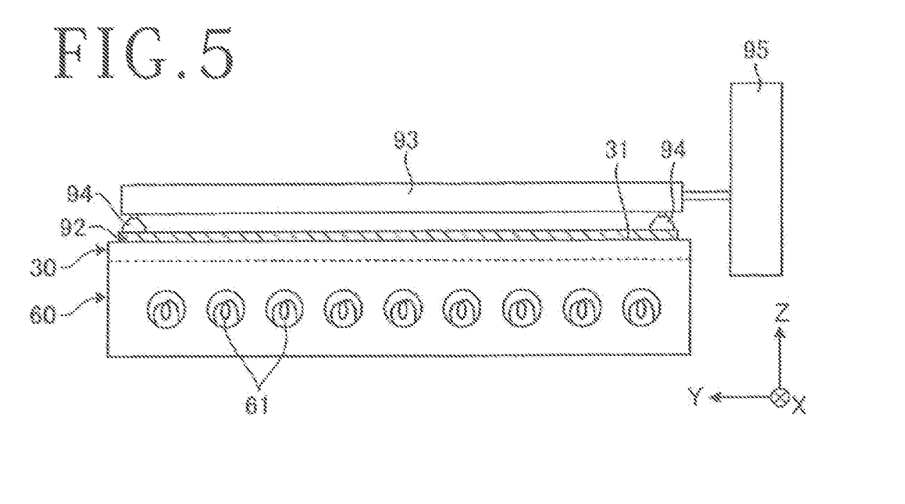
FIG. 5 is a cross-sectional view illustrating essential details of a sheet placing step of the sequence illustrated in FIG. 4.

FIG. 5 illustrates in cross section essential details of sheet placing step ST12 of the sequence illustrated in FIG. 4. Sheet placing step ST12 is a step in which the sheet supply unit 90 supplies the sheet 92 onto the holding surface 31 of the table 30, as illustrated in FIG. 5. Though sheet placing step ST12 may be omitted from the sequence, it should preferably be carried out because the sheet 92 can prevent the liquid resin 301 from smearing or otherwise damaging the holding surface 31 of the table 30 when the liquid resin 301 is supplied to holding surface 31 of the table 30.

Figure 6:
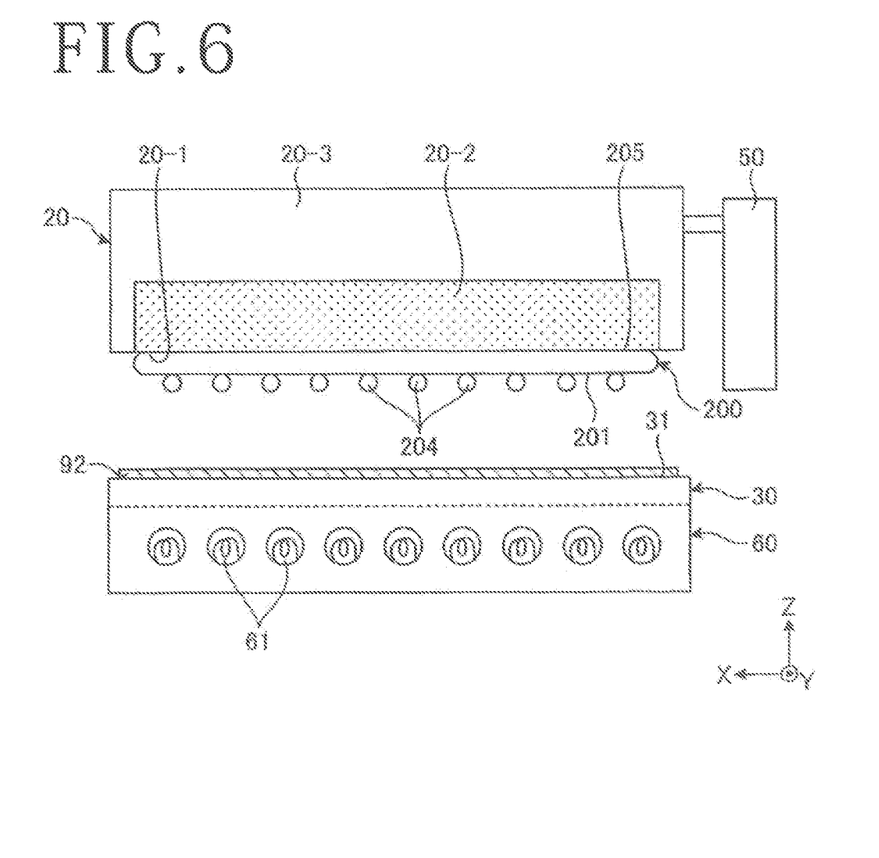
FIG. 6 is a cross-sectional view illustrating essential details of a wafer holding step of the sequence illustrated in FIG. 4.

FIG. 6 illustrates in cross section essential details of wafer holding step ST13 of the sequence illustrated in FIG. 4. Wafer holding step ST13 is a step in which the wafer 200 is held on the holder 20, as illustrated in FIG. 6.

As illustrated in FIG. 6, the holder 20 includes an attracting member 20-2 having a flat holding surface 20-1 as its lower surface and a frame 20-3 supporting the attracting member 20-2 securely fitted in a cavity defined centrally in the frame 20-3 and opening downwardly, as is the case with the temporary rest table 11. The attracting member 20-2 is made of a material similar to that of the attracting member 11-2. The attracting member 20-2 is connected to a vacuum suction source, not illustrated, through a vacuum suction channel, not illustrated, as is the case with the attracting member 11-2. The holding surface 20-1 in its entirety holds the wafer 200 thereon under suction forces generated by the vacuum suction source and acting through the vacuum suction channel on the holding surface 20-1.

In wafer holding step ST13, the moving unit 50 keeps the holding surface 20-1 of the holder 20 sufficiently spaced from the holding surface 31 of the table 30. Then, in wafer holding step ST13, the delivery unit 86 delivers the wafer 200 with the reverse side 205 facing vertically upwardly to a position below the holding surface 20-1 of the holder 20. In wafer holding step ST13, the holder 20 draws the upwardly facing reverse side 205 of the wafer 200 delivered to the position below the holding surface 20-1, under suction onto the holding surface 20-1. In wafer holding step ST13, therefore, the holder 20 holds the wafer 200 under suction on the holding surface 20-1 while the face side 201 with the bumps 204 is facing the holding surface 31 of the table 30 disposed therebelow.

Figure 7:
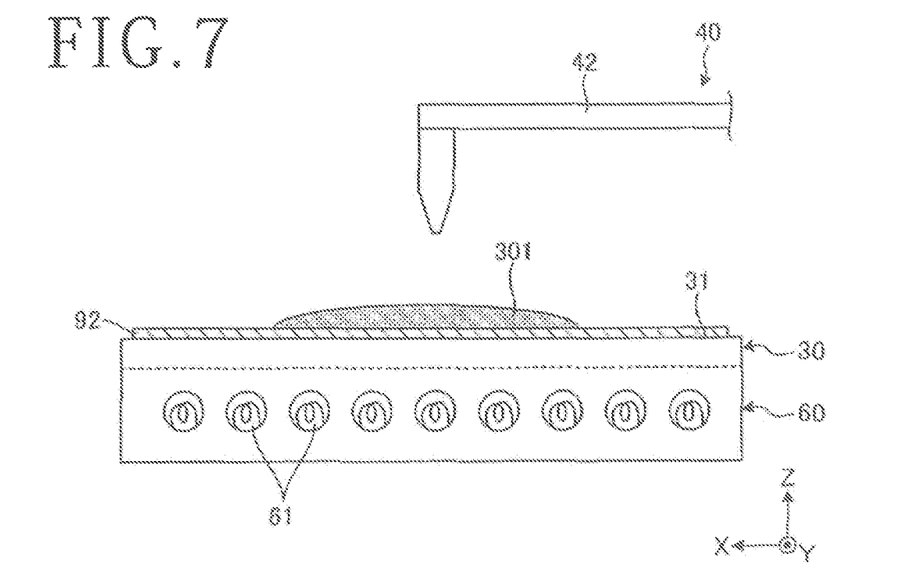
FIG. 7 is a cross-sectional view illustrating essential details of a resin supplying step of the sequence illustrated in FIG. 4.

FIG. 7 illustrates in cross section essential details of resin supplying step ST14 of the sequence illustrated in FIG. 4.

Resin supplying step ST14 is a step in which the resin supply unit 40 supplies the liquid resin 301 to the table 30 that faces the holder 20.

In resin supplying step ST14, specifically, the controller 70 calculates an appropriate amount of the liquid resin 301 to be supplied on the basis of the diameter of the wafer 200 obtained by the thickness measuring unit 10 and a desired resin thickness 311 (see FIG. 8) for the liquid resin 301 with which to coat the face side 201 of the wafer 200. The desired resin thickness 311 for the liquid resin 301 is calculated on the basis of a desired resin thickness 312 (see FIG. 10) for the resin 302 with which to coat the face side 201 of the wafer 200 and a shrinkage factor at which the liquid resin 301 is hardened into the resin 302.

In resin supplying step ST14, next, the resin supply unit 40 moves the tip end of the nozzle 42 from a retracted position away from the holding surface 31 of the table 30 to a supply position disposed above and facing the holding surface 31 of the table 30. In resin supplying step ST14, thereafter, the resin supply unit 40 supplies the appropriate amount of the liquid resin 301 calculated by the controller 70 from the nozzle 42 to the holding surface 31 of the table 30 on which the sheet 92 has been placed in sheet placing step ST12.

In the processing method according to the first embodiment, thickness measuring step ST11, sheet placing step ST12, wafer holding step ST13, and resin supplying step ST14 may not necessarily be carried out in the order named. In the processing method according to the first embodiment, specifically, it is sufficient that wafer holding step ST13 may be carried out after thickness measuring step ST11 and resin supplying step ST14 may be carried out after sheet placing step ST12, and a series of steps on the wafer 200 which include thickness measuring step ST11 and wafer holding step ST13 and a series of steps on the table 30 which include sheet placing step ST12 and resin supplying step ST14 may be carried out in any sequence or concurrent with each other. Resin applying step ST15 is carried out after all the steps from thickness measuring step ST11 to resin supplying step ST14 have been carried out.

Figure 8:
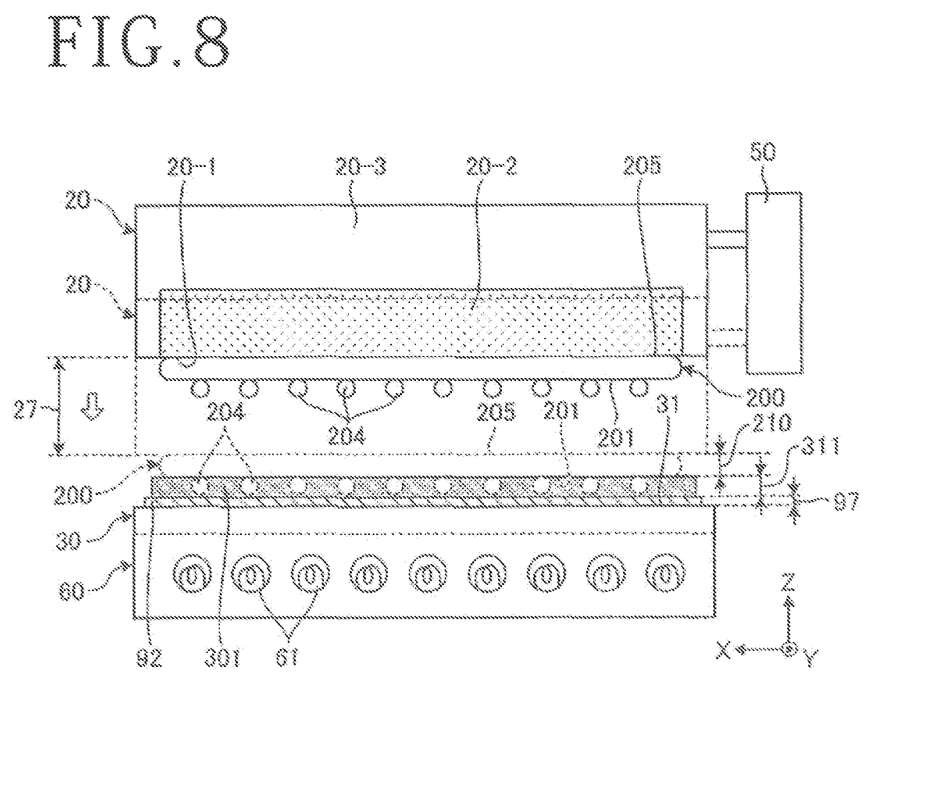
FIG. 8 is a cross-sectional view illustrating essential details of a first stage of a resin applying step of the sequence illustrated in FIG. 4.
Figure 9A:
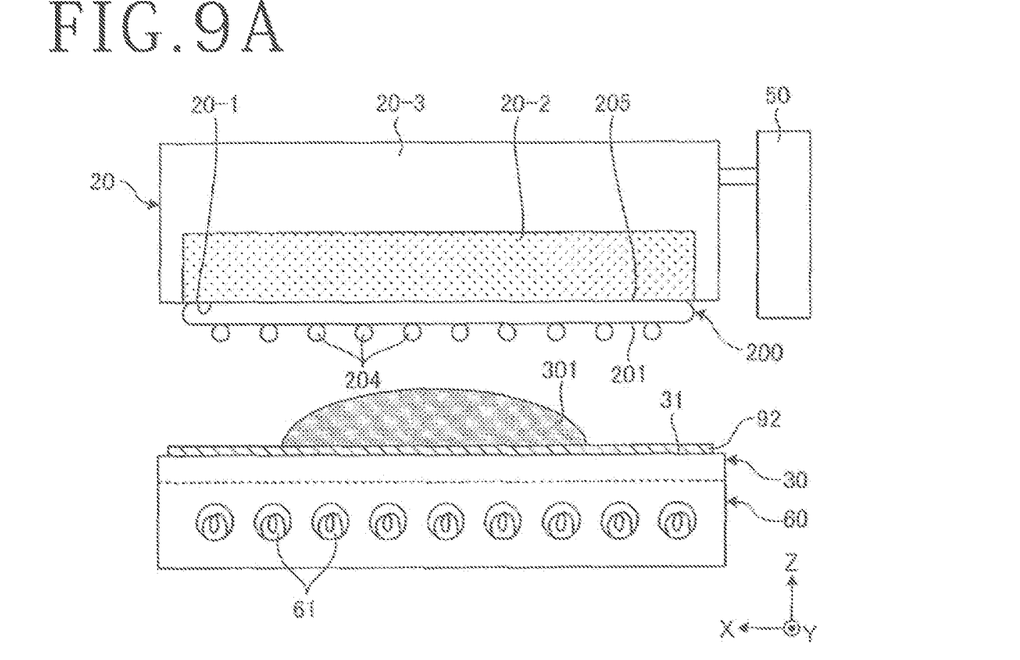
FIGS. 9A and 9B are cross-sectional views illustrating essential details of a second stage of the resin applying step of the sequence illustrated in FIG. 4.
Figure 9B:
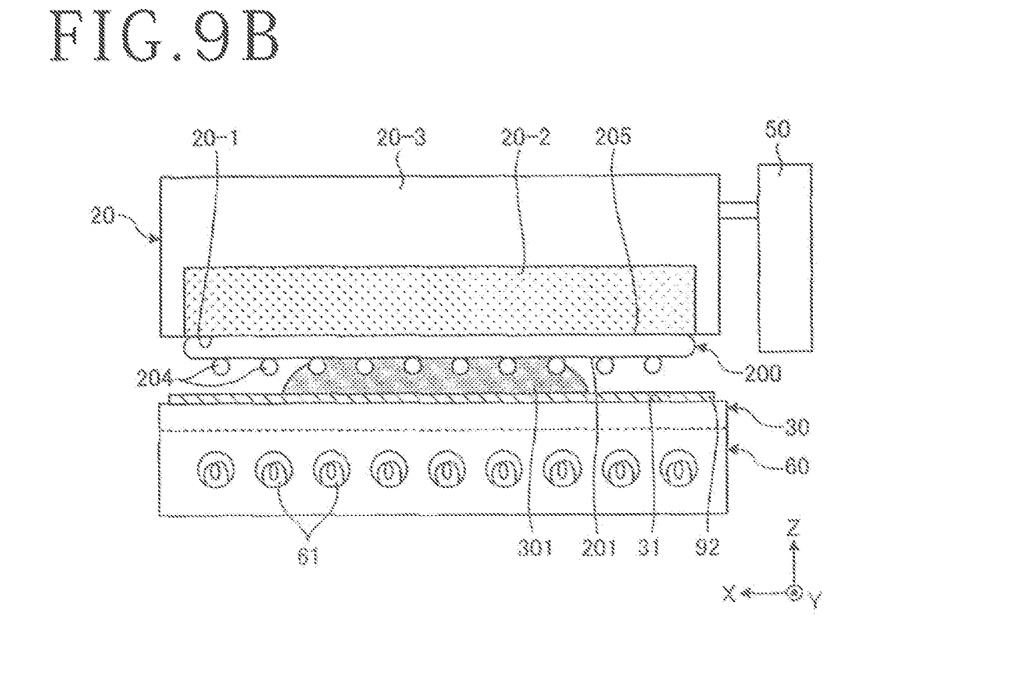

FIG. 8 illustrates in cross section essential details of a first stage of resin applying step ST15 of the sequence illustrated in FIG. 4. FIGS. 9A and 9B illustrate in cross section essential details of a second stage of resin applying step ST15 of the sequence illustrated in FIG. 4. FIG. 9A illustrates the components before the holder 20 and the table 30 are moved closely to each other, and FIG. 9B illustrates the components after the holder 20 and the table 30 have been moved closely to each other. As illustrated in FIGS. 9A and 9B, resin applying step ST15 is a step in which the moving unit 50 relatively moves the holder 20 and the table 30 closely to each other to coat the wafer 200 with the liquid resin 301. In resin applying step ST15, as illustrated in FIG. 8, the controller 70 determines a distance 27 by which the holder 20 and the table 30 are to be moved closely to each other on the basis of the thickness 210 of the wafer 200 that has been measured in thickness measuring step ST11, so that the spacing between the face side 201 of the wafer 200 held by the holder 20 which faces the table 30 and the holding surface 31 as the upper surface of the table 30 is equal to the sum of the desired resin thickness 311 for the liquid resin 301 and the thickness 97 of the sheet 92. In a case where sheet placing step ST11 is omitted, i.e., in a case where the sheet 92 is not used, the controller 70 determines a distance 27 by which the holder 20 and the table 30 are to be moved closely to each other on the basis of the thickness 210 of the wafer 200 that has been measured by the thickness measuring unit 10 in thickness measuring step ST11, so that the spacing between the face side 201 of the wafer 200 held by the holder 20 and the holding surface 31 of the table 30 is equal to the desired resin thickness 311 for the liquid resin 301. In other words, the controller 70 determines a distance 27 by which the holder 20 and the table 30 are to be moved closely to each other on the basis of the thickness 210 of the wafer 200 that has been measured by the thickness measuring unit 10 in thickness measuring step ST11, so that the spacing between the face side 201 of the wafer 200 held by the holder 20 and the holding surface 31 of the table 30 corresponds to the desired resin thickness 311 for the liquid resin 301.

According to the first embodiment, resin applying step ST15 includes a distance determining step as a first stage for determining a distance 27 by which the holder 20 and the table 30 are to be moved closely to each other and a resin deforming step as a second stage for deforming the liquid resin 301 with the holder 20 and the table 30 to coat the wafer 200 on the basis of the distance 27 determined in the distance determining step.

Taking into account the fact that the bumps 204 are embedded in the liquid resin 301 as indicated by the dotted lines in FIG. 8 when the liquid resin 301 is deformed in the resin deforming step, the wafer 200 that has the thickness 210, the liquid resin 301 to be applied to the desired resin thickness 311, and the sheet 92 that has the known thickness 97 are vertically layered between the holding surface 20-1 of the holder 20 and the holding surface 31 of the table 30. In view of this, in the distance determining step, as illustrated in FIG. 8, the controller 70 calculates and determines a distance 27 by which the holder 20 and the table 30 are to be moved closely to each other by subtracting the thickness 210 of the wafer 200 that has been measured in thickness measuring step ST11, the resin thickness 311 of the liquid resin 301 to be hardened that can be calculated on the basis of the resin thickness 312 for the hardened resin 302 that can be input to the controller 70 via the input/output interface apparatus by the operator, and the thickness 97 of the sheet 92 that is stored beforehand in the storage apparatus of the controller 70, from an initial spacing between the holding surface 20-1 of the holder 20 and the holding surface 31 of the table 30. In the distance determining step, it is not necessary to take into consideration and subtract the thickness 97 of the sheet 92 in a case where sheet placing step ST12 is omitted.

In the resin deforming step, as illustrated in FIGS. 9A and 9B, the moving unit 50 moves the holder 20 downwardly closely to the table 30 by the distance 27 determined in the distance determining step, causing the holding surface 20-1 of the holder 20 and the holding surface 31 of the table 30 to horizontally spread the liquid resin 301 therebetween with the wafer 200 and the sheet 92 interposed therebetween. In the resin deforming step, consequently, the liquid resin 301 to coat the face side 201 of the wafer 200 is formed between the face side 201 of the wafer 200 and the sheet 92. In the resin forming step, since the sheet 92 is flat, the surface of the liquid resin 301 that is held in contact with the sheet 92 is formed flatwise.

FIG. 10 illustrates in cross section essential details of hardening step ST16 of the sequence illustrated in FIG. 4. As illustrated in FIG. 10, hardening step ST16 is a step in which the liquid resin 301 applied to the wafer 200 is hardened in resin applying step ST15 into the resin 302 by the hardening unit 60.

In hardening step ST16, according to the first embodiment, the ultraviolet ray emission sections 61 of the hardening unit 60 emit ultraviolet rays 62 through the table 30 and the sheet 92 to the liquid resin 301 that is an ultraviolet-curable resin, hardening the liquid resin 301 into the resin 302, as illustrated in FIG. 10. In hardening step ST16, as the liquid resin 301 is hardened into the resin 302, the liquid resin 301 that has the resin thickness 311 is shrunk into the resin 302 that has the resin thickness 312 smaller than the resin thickness 311.

Figure 11:
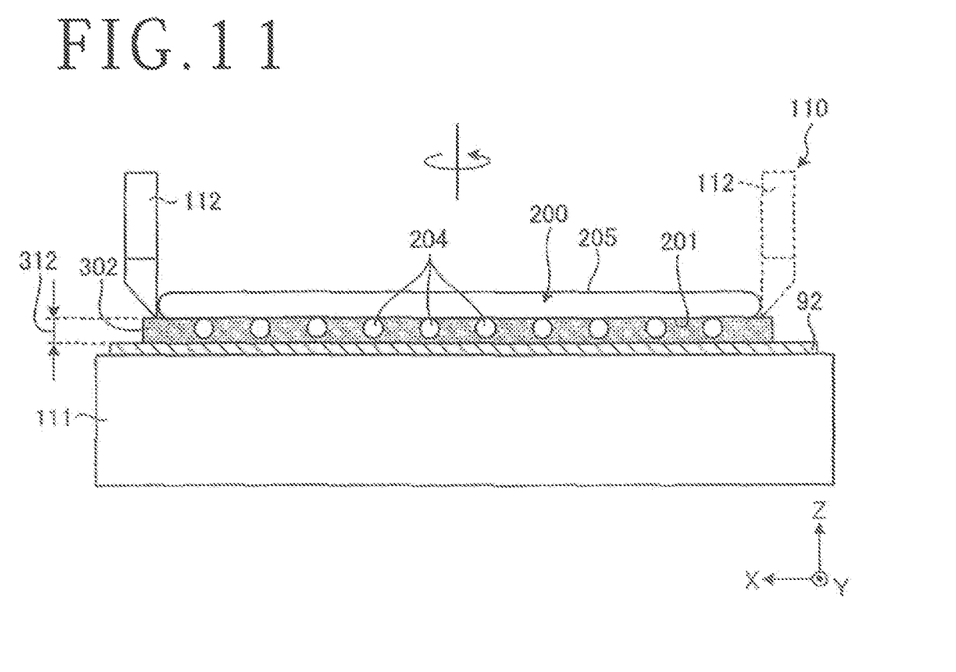
FIG. 11 is a cross-sectional view illustrating essential details of an excess portion removing step of the sequence illustrated in FIG. 4.

FIG. 11 illustrates in cross section essential details of excess portion removing step ST17 of the sequence illustrated in FIG. 4. As illustrated in FIG. 11, excess portion removing step ST17 is a step in which the excess portion removing unit 110 cuts off an excess portion, which protrudes radially outwardly from the outer edge of the wafer 200, of the resin 302 that has coated the face side 201 of the wafer 200.

In excess portion removing step ST17, specifically, the delivery unit 86 delivers the wafer 200 whose face side 201 has been coated with the resin 302 by the processing up to hardening step ST16, from the holder 20 to the excess portion removing unit 110, and places the wafer 200 on the holding table 111 with the resin 302 facing vertically downwardly.

In excess portion removing step ST17, next, as illustrated in FIG. 11, the excess portion removing unit 110 causes the cutter 112 to cut into the resin 302 vertically downwardly along the outer edge of the wafer 200 held on the holding table 111. In excess portion removing step ST17, thereafter, the excess portion removing unit 110 moves the cutter 112 that has cut into the resin 302 circumferentially along the outer edge of the wafer 200, cutting off the excess portion of the resin 302. In excess portion removing step ST17, the cutter 112 is caused to cut into the sheet 92 beyond the resin 302, so that any excess portion of the sheet 92 can be cut off simultaneously when the excess portion of the resin 302 is cut off. Even if the resin 302 is free of any excess portion, it is preferable to carry out excess portion removing step ST17 in order to cut off any excess portion of the sheet 92.

The resin applying machine 1 according to the first embodiment is able to produce the wafer 200 that has been coated with the resin 302 to the desired resin thickness 312, all over the face side 201 as one of the surfaces of the wafer 200, through the processing ranging from thickness measuring step ST11 to excess portion removing step ST17 of the processing method according to the first embodiment.

The resin applying machine 1 and the processing method according to the first embodiment, which are arranged as described above, determine the distance 27 by which the holder 20 and the table 30 are to be moved closely to each other on the basis of the thickness 210 of the wafer 200 that has been measured by the thickness measuring unit 10 in thickness measuring step ST11, so that the spacing between the face side 201 of the wafer 200 held by the holder 20 which faces the table 30 and the holding surface 31 as the upper surface of the table 30 is equal to the sum of the desired resin thickness 311 for the liquid resin 301 and the thickness 97 of the sheet 92, and relatively move the holder 20 and the table 30 closely to each other on the basis of the determined distance 27 to coat the wafer 200 with the liquid resin 301. Since the resin applying machine 1 and the processing method according to the first embodiment change the distance 27 by which the holder 20 and the table 30 are to be moved closely to each other depending on the measured thickness 210 of the wafer 200, they are advantageous in that they can reduce thickness variations of the resin 302 that has coated the wafer 200, which variations would otherwise be caused by variations of the thickness 210 of the wafer 200.

Specifically, in a case where a wafer 200 having a thickness 210 of 755 µm is used as an object to be coated with the resin 302, variations of the thickness 210 may possibly be of approximately ±25 µm with a relative error of 3%. In a case where the resin thickness 312 of the resin 302 to coat the wafer 200 is set to 100 µm, then if the resin thickness 312 suffers variations due to variations of the thickness 210 of the wafer 200 as heretofore, the relative error may reach 25%. With the resin applying machine 1 and the processing method according to the first embodiment, however, since variations of the thickness 210 of the wafer 200 are corrected per wafer 200 and then the wafer 200 is coated with the liquid resin 301, variations of the resin thickness 312 that possibly tend to occur due to variations of the thickness 210 of the wafer 200 are greatly reduced in terms of a converted relative error.

In a case where sheet placing step ST12 is omitted, i.e., in a case where the sheet 92 is not used, the distance 27 by which the holder 20 and the table 30 are to be moved closely to each other may be determined on the basis of the thickness 210 of the wafer 200 that has been measured by the thickness measuring unit 10 in thickness measuring step ST11, so that the spacing between the face side 201 of the wafer 200 held by the holder 20 and the holding surface 31 of the table 30 is equal to the desired resin thickness 311 for the liquid resin 301. In other words, the distance 27 by which the holder 20 and the table 30 are to be moved closely to each other may be determined on the basis of the thickness 210 of the wafer 200 that has been measured by the thickness measuring unit 10 in thickness measuring step ST11, so that the spacing between the face side 201 of the wafer 200 held by the holder 20 and the holding surface 31 of the table 30 corresponds to the desired resin thickness 311 for the liquid resin 301.

In addition, the resin applying machine 1 according to the first embodiment further includes the temporary rest table 11 having the holding surface 11-1 for holding the wafer 200, the holding surface 11-1 being smaller than the diameter of the wafer 200. The thickness measuring unit 10 includes the first measuring section 12 for contacting a portion of the face side 201 of the wafer 200 that protrudes radially outwardly from the temporary rest table 11 and measuring the height of the face side 201 of the wafer 200, the second measuring section 13 for contacting a portion of the reverse side 205 of the wafer 200 that protrudes radially outwardly from the temporary rest table 11 and measuring the height of the reverse side 205 of the wafer 200, and the calculating section 14 for calculating the thickness 210 of the wafer 200 from the difference between the height of the face side 201 and the height of the reverse side 205. Therefore, inasmuch as the resin applying machine 1 according to the first embodiment is able to measure the thickness 210 of the wafer 200 more accurately and reflect the measured thickness 210 in the distance 27 by which the holder 20 and the table 30 are to be moved closely to each other for coating the wafer 200 with the liquid resin 301, the resin applying machine 1 is advantageous in that it can more reliably reduce thickness variations of the resin 302 that has coated the wafer 200, which variations would otherwise be caused by variations of the thickness 210 of the wafer 200.

Second Embodiment

Figure 12A:
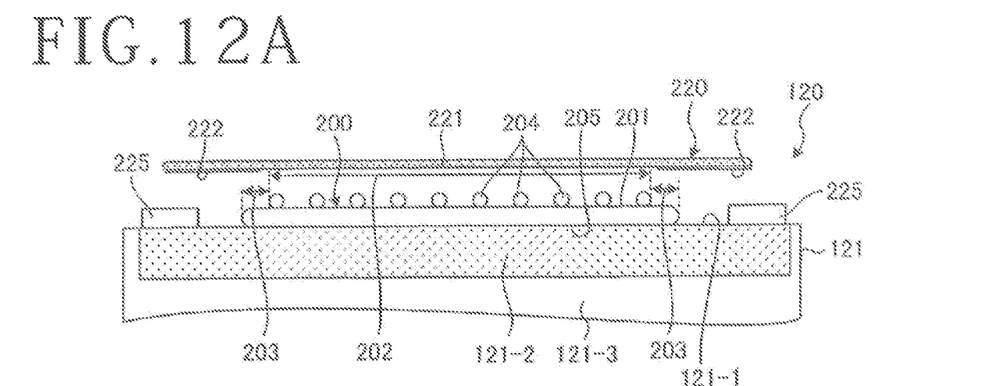
FIGS. 12A and 12B are cross-sectional views illustrating essential details of a tape affixing step according to a second embodiment of the present invention.
Figure 12B:
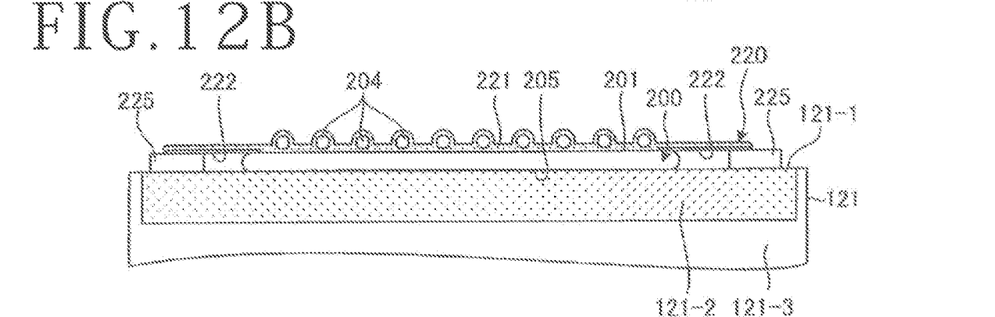
Figure 13:
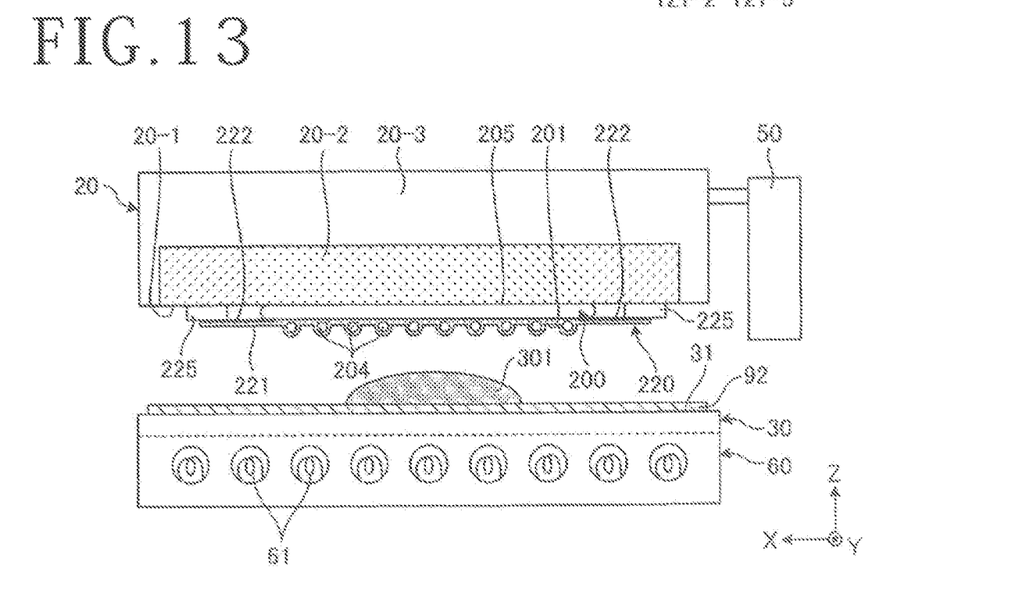
FIG. 13 is a cross-sectional view illustrating essential details of a resin applying step according to the second embodiment.

A resin applying machine 1 and a processing method according to a second embodiment of the present invention will be described below with reference to the drawings. FIGS. 12A and 12B illustrate in cross section essential details of a tape affixing step according to the second embodiment. FIG. 12A illustrates the wafer 200 and a tape 220 before the tape 220 is affixed to the wafer 200. FIG. 12B illustrates the wafer 200 and the tape 220 after the tape 220 has been affixed to the wafer 200. FIG. 13 illustrates in cross section essential details of resin applying step ST15 according to the second embodiment. Those parts in FIGS. 12A, 12B, and 13 which are identical to those of the first embodiment are denoted by identical reference characters, and will not be described in detail below.

The resin applying machine 1 according to the second embodiment is similar to the resin applying machine 1 according to the first embodiment except that a tape affixing unit 120 is added. As illustrated in FIGS. 12A and 12B, the tape affixing unit 120 includes a holding table 121 for holding the wafer 200 as an object to which the tape 220 is to be affixed and an annular frame 225 to be mounted on an outer edge portion of the tape 220, and a tape supply unit, not illustrated, for supplying the tape 220 and affixing the tape 220 to the wafer 200 and the annular frame 225. According to the second embodiment, the tape affixing unit 120 includes the tape supply unit. However, the present invention is not limited to such details. Rather, the tape supply unit may be dispensed with, and the tape 220 may be supplied and affixed to the wafer 200 and the annular frame 225 by the operator.

As illustrated in FIGS. 12A and 12B, the holding table 121 includes an attracting member 121-2 having a flat holding surface 121-1 as its upper surface and a frame 121-3 supporting the attracting member 121-2 securely fitted in a cavity defined centrally in the frame 121-3 and opening upwardly, as is the case with the temporary rest table 11 and the holder 20. The attracting member 121-2 is made of a material similar to those of the attracting member 11-2 and the attracting member 20-2. The attracting member 121-2 is connected to a vacuum suction source, not illustrated, through a vacuum suction channel, not illustrated, as is the case with the attracting member 11-2 and the attracting member 20-2. The holding surface 121-1 in its entirety holds the wafer 200 and the annular frame 225 thereon under suction forces generated by the vacuum suction source and acting through the vacuum suction channel on the holding surface 121-1.

The tape 220 used in the tape affixing unit 120 includes a tape base 221 larger than the diameter of the wafer 200 and an adhesive layer 222 disposed on a surface of the tape base 221. The tape base 221 has a central area facing the device area 202 of the wafer 200 and free of the adhesive layer 222, and an outer circumferential area including an outer edge portion that faces the outer circumferential excess area 203 of the wafer 200 and the annular frame 225, the adhesive layer 222 being disposed on the outer circumferential area.

The processing method according to the second embodiment includes a tape affixing step before wafer holding step ST13 of the processing method according to the first embodiment, with resulting changes in resin applying step ST15.

As illustrated in FIGS. 12A and 12B, the tape applying step is a step in which the tape 220 is affixed to the face side 201 of the wafer 200, which is a surface to be coated with the resin 302, and the annular frame 225 is mounted on the outer edge portion of the tape 220.

In the tape affixing step, specifically, as illustrated in FIG. 12A, the holding table 121 of the tape affixing unit 120 holds the reverse side 205 of the wafer 200 under suction on a central area of the holding surface 121-1, and the outer circumferential area of the holding surface 121-1 holds the annular frame 225 under suction thereon. Next, the tape supply unit of the tape affixing unit 120 supplies the tape 220 to a position over the wafer 200 and the annular frame 225, where the central area of the tape 220 that is free of the adhesive layer 222 faces the face side 201 of the device area 202 of the wafer 200 and the surface, which faces the adhesive layer 222, of the outer circumferential area of the tape 220 with the adhesive layer 222 disposed thereon faces the face side 201 of the outer circumferential excess area 203 of the wafer 200 and the annular frame 225.

In the tape affixing step, thereafter, as illustrated in FIG. 12B, the tape supply unit of the tape affixing unit 120 brings the central area of the tape 220 that is free of the adhesive layer 222 into intimate contact with the face side 201 of the device area 202 of the wafer 200, and affixes the outer circumferential area of the tape 220 on which the adhesive layer 222 is disposed to the face side 201 of the outer circumferential excess area 203 of the wafer 200 and the annular frame 225 with the adhesive layer 222 interposed therebetween.

In the distance determining step of resin applying step ST15 according to the second embodiment, the controller 70 calculates and determines a distance 27 by which the holder 20 and the table 30 are to be moved closely to each other in a case where the thickness of the tape 220 is corrected by further subtracting the thickness of the central area of the tape 220 that is free of the adhesive layer 222 that has been brought into intimate contact with the face side 201 of the device area 202 of the wafer 200 in the tape affixing step, i.e., the thickness of the tape base 221, from the initial spacing between the holding surface 20-1 of the holder 20 and the holding surface 31 of the table 30, in the distance determining step of resin applying step ST15 according to the first embodiment.

The resin deforming step of resin applying step ST15 according to the second embodiment is based on the distance 27 by which the holder 20 and the table 30 are to be moved closely to each other in a case where the thickness of the tape 220 is corrected in the resin deforming step of resin applying step ST15 according to the first embodiment.

The resin applying machine 1 and the processing method according to the second embodiment, which are arranged as described above, are advantageous in that they can reduce thickness variations of the resin 302 that has coated the wafer 200, which variations would otherwise be caused by variations of the thickness 210 of the wafer 200, as is the case with the resin applying machine 1 and the processing method according to the first embodiment. In addition, the resin applying machine 1 and the processing method according to the second embodiment offer other advantages similar to those of the resin applying machine 1 and the processing method according to the first embodiment.

Furthermore, inasmuch as the resin applying machine 1 and the processing method according to the second embodiment carry out resin applying step ST15 while correcting the thickness of the tape 220, the resin applying machine 1 and the processing method according to the second embodiment are also advantageous in that they can reduce thickness changes of the resin 302 that has coated the wafer 200, which changes would otherwise be caused by the thickness of the tape 220.

The present invention is not limited to the embodiments described above. Various changes and modifications may be made therein without departing from the scope of the invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for coating a surface of a wafer with a liquid resin, comprising the steps of:
measuring a thickness of the wafer;
placing a sheet onto a holding surface of a table;
holding the wafer on a holder;
supplying the liquid resin to the table that faces the holder;
applying the liquid resin to coat the wafer with the liquid resin; and
wherein the applying the liquid resin includes
relatively moving the holder and the table closely to each other to coat the wafer with the liquid resin,
deforming the liquid resin by moving the holder downwardly to horizontally spread the liquid resin interposed therebetween with the holder and sheet;
hardening the liquid resin that has coated the wafer,
removing excess portion of the liquid resin which protrudes radially outwardly from an outer edge of the wafer,
wherein a distance by which the holder and the table are to be relatively moved closely to each other to coat the wafer with the liquid resin is determined depending on the measured thickness of the wafer.

* * * * *